US008801500B2

(12) United States Patent
Pietsch

(10) Patent No.: US 8,801,500 B2
(45) Date of Patent: Aug. 12, 2014

(54) METHOD FOR THE SIMULTANEOUS MATERIAL-REMOVING PROCESSING OF BOTH SIDES OF AT LEAST THREE SEMICONDUCTOR WAFERS

(75) Inventor: Georg Pietsch, Burghausen (DE)

(73) Assignee: Siltronic AG, Munich (DE)

( * ) Notice: Subject to any disclaimer, the term of this patent is extended or adjusted under 35 U.S.C. 154(b) by 416 days.

(21) Appl. No.: 13/313,114

(22) Filed: Dec. 7, 2011

(65) Prior Publication Data

US 2012/0156970 A1    Jun. 21, 2012

(30) Foreign Application Priority Data

Dec. 15, 2010 (DE) .......................... 10 2010 063 179

(51) Int. Cl.
*B24B 1/00* (2006.01)
*B24B 7/17* (2006.01)
*B24B 7/22* (2006.01)

(52) U.S. Cl.
CPC .. *B24B 7/17* (2013.01); *B24B 7/228* (2013.01)
USPC .............................. 451/41; 451/63

(58) Field of Classification Search
CPC ............ B24B 7/17; B24B 7/228; B24B 7/08; B24B 7/28
USPC ............. 451/41, 63, 260–262, 268–271, 397, 451/398, 400
See application file for complete search history.

(56) References Cited

U.S. PATENT DOCUMENTS

| | | | |
|---|---|---|---|
| 6,299,514 B1 | 10/2001 | Boller | |
| 6,843,704 B2 * | 1/2005 | Potempka | 451/5 |
| 8,113,913 B2 * | 2/2012 | Pietsch et al. | 451/7 |
| 2006/0128276 A1 * | 6/2006 | Horiguchi et al. | 451/41 |
| 2008/0166952 A1 | 7/2008 | Ueno | |
| 2008/0233840 A1 | 9/2008 | Pietsch et al. | |
| 2009/0298396 A1 | 12/2009 | Hashii et al. | |
| 2009/0298397 A1 | 12/2009 | Yamada et al. | |

FOREIGN PATENT DOCUMENTS

| | | |
|---|---|---|
| CN | 101829948 A | 9/2010 |
| DE | 10007390 A1 | 10/2000 |
| DE | 10159848 A1 | 6/2003 |

(Continued)

OTHER PUBLICATIONS

Kasai, Toshi: Kinematic analysis disk motion in a double sided polisher for chemical mechanical planarizaton (CMP), Tribology International, 41, 2008. p. 111-118.

*Primary Examiner* — Maurina Rachuba
(74) *Attorney, Agent, or Firm* — Leydig, Voit & Mayer, Ltd.

(57) ABSTRACT

A method for the simultaneous material-removing processing of both sides of at least three semiconductor wafers includes providing a double-side processing apparatus including two rotating ring-shaped working disks and a rolling apparatus. The carriers are arranged in the double-side processing apparatus and the openings are disposed in the carriers so as to satisfy the inequality:

$$R/e \cdot \sin(\pi/N^*) - r/e - 1 \leq 1.2$$

where $N^*$ denotes a ratio of the round angle and an angle at which adjacent carriers are inserted into the rolling apparatus with the greatest distance with respect to one another, r denotes a radius of each opening for receiving a respective semiconductor wafer, e denotes a radius of a pitch circle around a midpoint of the carrier on which the opening is arranged, and R denotes a radius of the pitch circle on which the carriers move between the working disks by means of the rolling apparatus.

9 Claims, 4 Drawing Sheets

(56) References Cited

FOREIGN PATENT DOCUMENTS

| JP | 2004148497 A | 5/2004 |
|---|---|---|
| JP | 2006150507 A | 6/2006 |
| JP | 2008235899 A | 10/2008 |
| JP | 2009004616 A | 1/2009 |
| JP | 2009196012 A | 9/2009 |
| JP | 2010221348 A | 10/2010 |

* cited by examiner

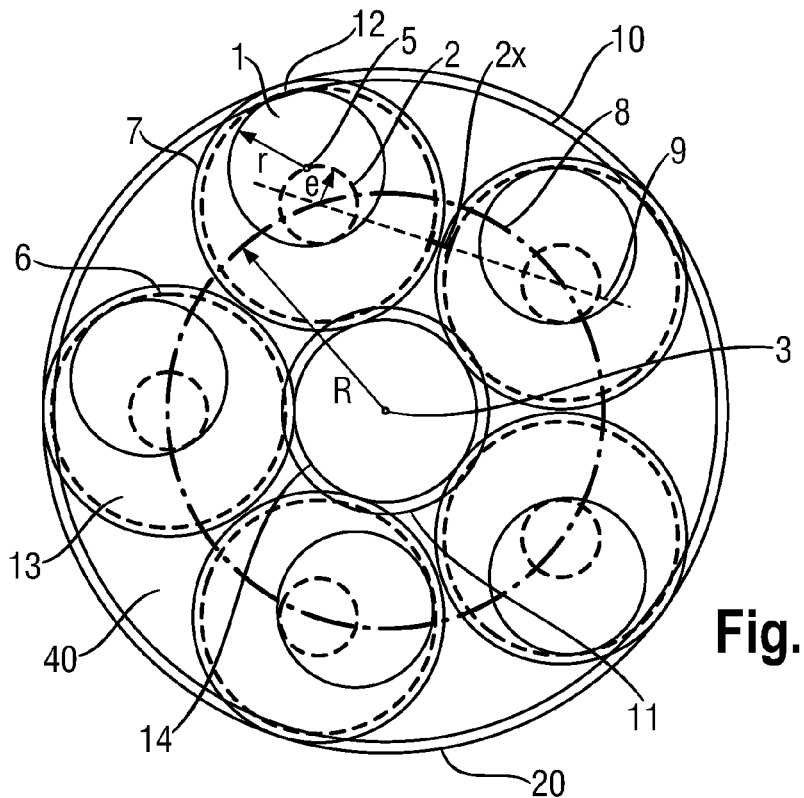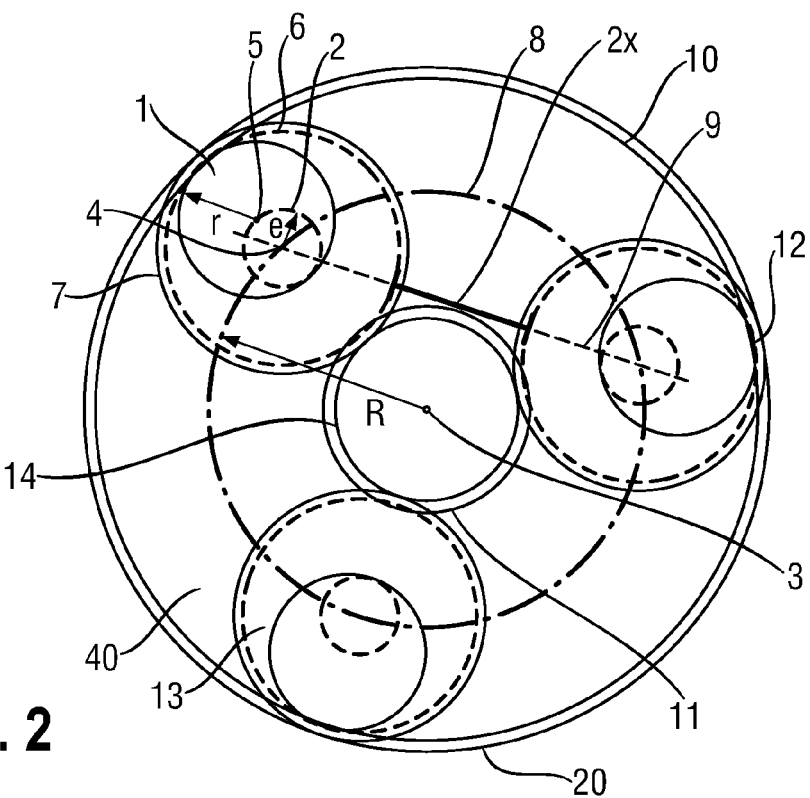

METHOD FOR THE SIMULTANEOUS MATERIAL-REMOVING PROCESSING OF BOTH SIDES OF AT LEAST THREE SEMICONDUCTOR WAFERS

CROSS REFERENCE TO RELATED APPLICATIONS

The application claims priority to German Patent Application No. DE 10 2010 063 179.5, filed on Dec. 15, 2010, which is hereby incorporated by reference herein in its entirety.

FIELD

The present invention relates to a method for the simultaneous material-removing processing of both sides of at least three semiconductor wafers between two rotating ring-shaped working disks of a double-side processing apparatus, wherein the double-side processing apparatus has a rolling apparatus, which causes at least three carriers to rotate, and wherein each of the carriers has precisely one opening, into which a semiconductor wafer is respectively inserted in a freely movable fashion, such that the semiconductor wafers are moved on a cycloidal trajectory between the working disks.

BACKGROUND

Electronics, microelectronics and microelectromechanics require as starting materials semiconductor wafers which have to meet extreme demands regarding global and local flatness, single-side-referenced flatness (nanotopology), roughness and cleanness. Semiconductor wafers are wafers composed of semiconductor materials such as elemental semiconductors (silicon, germanium), compound semiconductors (for example composed of an element of the third main group of the periodic table, such as aluminum, gallium or indium plus an element of the fifth main group of the periodic table such as nitrogen, phosphorus or arsenic) or the compounds thereof (for example $Si_{1-x}Ge_x$, $0<x<1$).

In accordance with the prior art, semiconductor wafers are produced by means of a multiplicity of successive process steps which can generally be classified into the following groups:
(a) producing a usually monocrystalline semiconductor rod;
(b) slicing the rod into individual wafers;
(c) mechanical processing;
(d) chemical processing;
(e) chemomechanical processing;
(f) if appropriate additionally producing layer structures.

Advantageous methods in the context of steps (c) and (e) in this case include so-called "free floating processes" (FFP), in which both sides of a semiconductor wafer are simultaneously processed in material-removing fashion in one work step, to be precise in such a way that the processing forces acting on the semiconductor wafer on the front and rear sides during the material removal compensate for one another, such that the semiconductor wafer is processed in "free floating" fashion substantially without constraining forces of a guide apparatus being exerted. In this case, "substantially" means that, as a result of the kinematic characteristics of the process, the forces acting on the front and rear sides during processing can at least in principle precisely balance one another and that low resulting residual forces that may occur, will occur only on account of statistical fluctuations or external disturbance variables. By means of FFP, defects of form as a result of prior processes can be removed particularly effectively and with little material removal, and the FFP impress hardly any processing-characteristic new defects of form attributed to them on the semiconductor wafers.

In the prior art, preference is given to sequences for producing semiconductor wafers in which at least one of the process steps involved is an FFP. In the prior art, particular preference is given to sequences in which at least one FFP comprises a method in which both sides of at least two semiconductor wafers are simultaneously processed in a material-removing fashion between two ring-shaped working disks, wherein the semiconductor wafers are inserted loosely into in each case at least one receiving opening overall of at least one thin guide cage (carrier) toothed on the outside, which are guided by means of a rolling apparatus and the outer toothing under pressure on cycloidal paths relative to the working disks, such that they rotate completely around the midpoint of the double-side processing apparatus (planetary movement). Such kinematics are used for the lapping, grinding or polishing of semiconductor wafers.

US2009/0298396A1 and US2009/0298397A1 describe double-side grinding methods with planetary kinematics, which are intended to lead to a very flat surface without edge roll-off even in the case of semiconductor wafers having a diameter of 450 mm. In this case, a plurality of semiconductor wafers having the same diameter are arranged in a carrier on precisely one pitch circle around the midpoint of the carrier in such a way that the ratio of the area of the pitch circle to the area of a semiconductor wafer is between 1.33 and 2.0. US2009/0298396A1 furthermore makes certain requirements of the size and arrangement of the abrasive pellets used in the method. By contrast, US2009/0298397A1 describes a grinding method with the same arrangement of the semiconductor wafers in the carriers, but an alkaline solution is used in addition to the bonded abrasive, and the rotational speed of the semiconductor wafers is between 5 and 80 revolutions per minute. It has been found, however, that complying with these requirements does not suffice to obtain semiconductor wafers having the required plane-parallelism of the flat surfaces. Particularly in the case of an arrangement with only one large semiconductor wafer per carrier, sufficient flatness was often not obtained. With most of the commercially available double-side processing apparatuses, an arrangement like that cannot be avoided for example in the case of semiconductor wafers having a diameter of 450 mm, since the corresponding carriers are not large enough for receiving a plurality of semiconductor wafers of that size.

Other arrangements of semiconductor wafers in the carriers and of carriers in the double-side processing apparatus are also known. By way of example DE10159848A1 specifies that, in a double-side polishing apparatus mentioned by way of example, having a diameter of 1970 mm for the outer drive ring and 530 mm for the inner drive ring, it is possible to insert up to 5 carriers having a pitch circle diameter of the outer toothing of 720 mm. In each carrier there is space for three semiconductor wafers having a diameter of 300 mm. In general, however, the arrangements disclosed are not considered to be related to the plane-parallelism that can be obtained by the processing.

FIG. 8 shows the essential elements of an apparatus according to the prior art that is suitable for carrying out the method according to the invention. The apparatus is suitable for simultaneous double-side lapping, grinding or polishing with planetary kinematics. The illustration shows the basic schematic diagram of a two-disk machine for processing disk-shaped workpieces such as semiconductor wafers, such as is disclosed for example in DE10007390A1, in perspective view. FIGS. 1 to 4 show a plan view of the arrangement of the carriers 13 and of the openings 1 within the carriers 13. The reference symbols used in the following description of the apparatus and the way in which the apparatus works relate to these five figures.

An apparatus of this type consists of an upper working disk 31 and a lower working disk 32 and a rolling apparatus formed from an inner drive ring 33 and an outer drive ring 35, carriers 13 being inserted into said rolling apparatus. The working disks of an apparatus of this type are ring-shaped. The carriers have openings 1 which receive the semiconductor wafers 36. (Carriers each having three openings are illustrated. By contrast, the invention relates to carriers having only one opening.)

During processing, the working disks 31 and 32 and the drive rings 33 and 35 rotate at rotational speeds $n_o$, $n_u$, $n_i$ and $n_a$ concentrically around the midpoint 3 of the entire apparatus (four-way drive). As a result, the carriers on the one hand rotate on a pitch circle 8 around the midpoint 3 and on the other hand simultaneously perform an inherent rotation about their respective midpoints 4. For an arbitrary point of a semiconductor wafer, a characteristic trajectory (kinematics), results with respect to the lower working disk 32 and the upper working disk 31, said trajectory being referred to as a trochoid. A trochoid is understood as the generality of all regular, shortened or lengthened epi- or hypocycloids.

Depending on the type of processing method (lapping, polishing, grinding), the upper working disk 31 and lower working disk 32 can bear working layers 39, 40. They are polishing pads in the case of polishing, and working layers containing bonded abrasive in the case of grinding. The interspace formed between the working layers 39 and 40 is referred to as a working gap 30, in which the semiconductor wafers 36 move during processing.

At least one working disk, for example the upper working disk 31, contains holes 34 through which operating agents can be fed to the working gap 30, for example a cooling lubricant, a polishing agent or a lapping agent. In addition, measuring devices 37 for measuring the width of the working gap 30 can be present.

During lapping, a slurry of loose hard substances having an abrasive effect (lapping agent, lapping slurry) is fed to the working gap 30 and material removal from the semiconductor wafer 36 is effected in this way. The working surfaces of the working disks 31, 32 contain no abrasive in this case.

During grinding, by contrast, the working disks 31, 32 respectively comprise a working layer 39, 40 facing the working gap 30 and containing fixedly bonded abrasive. A cooling lubricant containing no substances having an abrasive action is fed to the working gap 30. The working layer can consist of an elastic abrasive pad containing fixedly bonded abrasive. This is referred to as a PPG method ("planetary pad grinding"). The abrasive pad is connected to the working disk magnetically, by vacuum, by hook-and-loop fastening or by adhesive bonding for the duration of use and can be removed by a peeling movement after use and thus be changed rapidly. Alternatively, the working layer 39 can also consist of a multiplicity of rigid abrasive bodies (so-called pellets). The abrasive bodies are embodied as cylinders, hollow cylinders or right prisms and by their end faces are adhesively bonded, screwed or incorporated into the surface of the working disk. Changing worn abrasive bodies is more complicated than changing the abrasive pads.

During polishing (double-side polishing, DSP), the working layers 39, 40 are polishing pads without any abrasive substances. A polishing agent (polishing slurry) containing abrasive substances, preferably a colloidally disperse alkaline silica sol, is fed to the working gap 30 formed between the polishing pads. The polishing pad is elastic and, similarly to the abrasive pad in the PPG method, can be removed from the working disk by means of a peeling movement and is therefore easy to change.

SUMMARY

An aspect of the present invention is to improve the known double-side processing methods with planetary kinematics such that particularly plane-parallel semiconductor wafers can be produced economically even in the case of very large diameters such as 450 mm, for example.

In an embodiment, the present invention provides a method for the simultaneous material-removing processing of both sides of at least three semiconductor wafers between two rotating ring-shaped working disks of a double-side processing apparatus, wherein the double-side processing apparatus has a rolling apparatus, which causes at least three carriers to rotate, and wherein each of the carriers has precisely one opening, into which a semiconductor wafer is respectively inserted in a freely movable fashion, such that the semiconductor wafers are moved on a cycloidal trajectory between the working disks, wherein the arrangement of the carriers in the double-side processing apparatus and of the openings in the carriers is such that the inequality $$R/e \cdot \sin(\pi/N^*) - r/e - 1 \leq 1.2$$

is satisfied, where $N^*$ denotes the ratio of the round angle and the angle at which the adjacent carriers are inserted into the rolling apparatus with the greatest distance with respect to one another, r denotes the radius of an opening for receiving a semiconductor wafer, e denotes the radius of the pitch circle around the midpoint of the carrier on which the opening is arranged, and R denotes the radius of the pitch circle on which the carriers move between the working disks by means of the rolling apparatus.

No relationship between the arrangement of the semiconductor wafers in a carrier, the arrangement of the carriers on the working disk and the obtainable plane-parallelism of the processed semiconductor wafers is known in the prior art. Embodiments of the present invention are based on the observation that independently of the choice of material removal mechanism (grinding, lapping, polishing), and independently of the choice of the method (lapping method, pellets grinding, PPG grinding, double-side polishing), from the number of possible combinations of the arrangement of the semiconductor wafers in the carrier and the arrangement of the carriers on the working disk, only a small selection range is suitable for economically producing semiconductor wafers with a high degree of plane-parallelism which are suitable for particularly demanding applications.

BRIEF DESCRIPTION OF THE FIGURES

Exemplary embodiments of the invention are described in more detail below with reference to the drawings, in which:

FIG. 1 shows an example of an arrangement according to the invention of a semiconductor wafer in a carrier and number, size and arrangement of the carriers in the double-side processing apparatus.

FIG. 2 shows a comparative example of an arrangement not according to the invention of a semiconductor wafer in a carrier and number, size and arrangement of the carriers in the double-side processing apparatus.

DETAILED DESCRIPTION OF THE INVENTION

Figure 3:
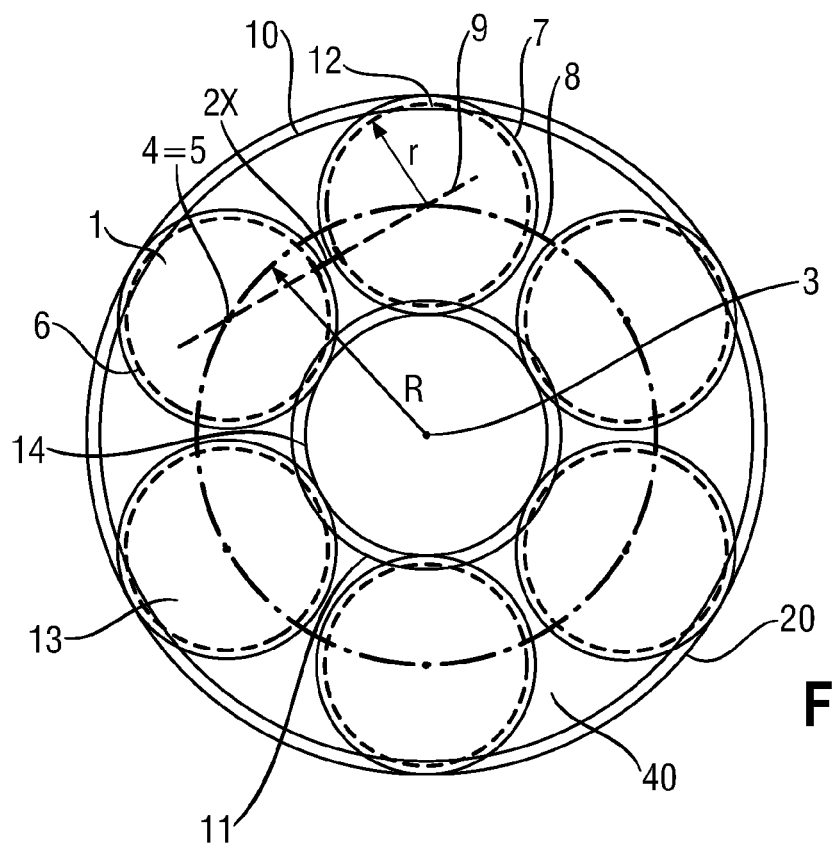
FIG. 3 shows a further comparative example of an arrangement not according to the invention of a semiconductor wafer in a carrier and number, size and arrangement of the carriers in the double-side processing apparatus.

Embodiments of the invention are based on a large number of experiments with different double-side processing methods (double-side polishing, lapping, pellets grinding and PPG grinding) and corresponding apparatuses with different numbers and arrangements of the semiconductor wafers in the carriers as well as varying numbers, sizes and arrangements of carriers in the respective double-side processing apparatus. The invention is based on the insight gained here that all the methods, despite their different material removal mechanisms (chemical, erosive, chipping) and differences in the apparatuses used, evidently have in common fundamental kinematic and topological conditions which have to be met in order to profitably achieve very flat semiconductor wafers suitable for particularly demanding applications. The cited methods in accordance with the prior art do not recognize these correlations or consider only isolated partial aspects of these correlations which do not suffice to enable the economic production of semiconductor wafers having a particularly flat form.

The invention relates to the ratio of the two parameters x and e (see FIG. 1): x is half the distance between the envelopes 6 of the openings 1 in adjacent carriers 13 for receiving a semiconductor wafer. In this case, the envelope 6 of the opening 1 arranged in a carrier 13 should be understood to mean the circle within the carrier 13 and the midpoint 4 thereof which borders the area swept over by the opening 1 upon rotation of the carrier 13 about its midpoint 4. To put it another way, the enveloping circular line 6 is that circular line around the midpoint 4 of the carrier 13 which precisely still completely encompasses the entire area of the opening 1. e is the eccentricity of the opening 1 on the carrier 13, that is to say the radius of the pitch circle 2 on which the opening 1 is arranged around the center 4 of the respective carrier 13.

The invention is based on the observation, in particular, that the ratio x/e has to be chosen from a very limited range in order to obtain particularly flat semiconductor wafers and at the same time to be able to carry out the method particularly economically.

Any person skilled in the art who is familiar with the described double-side group processing methods with rotating carriers will attempt to carry out the method as economically as possible, that is to say that said person will ensure that the total area of the semiconductor wafers processed simultaneously in a machine batch occupies a greatest possible proportion of the area available on the ring-shaped working disks for the processing.

The essential insight of the present invention is, then, that the semiconductor wafers in this case must not be arranged arbitrarily, rather the arrangement of the opening 1 within a carrier 13 and the distances between the envelopes 6 of the adjacent carriers 13 have to be chosen such that the ratio x/e is less than or equal to 1.2.

Given uniform distances between respectively adjacent carriers 13 and identical arrangements of the opening 1 on all the carriers 13, the ratio x/e can be calculated as follows:

$$x/e = R/e \cdot \sin(\pi/N) - r/e - 1$$

Figure 8:
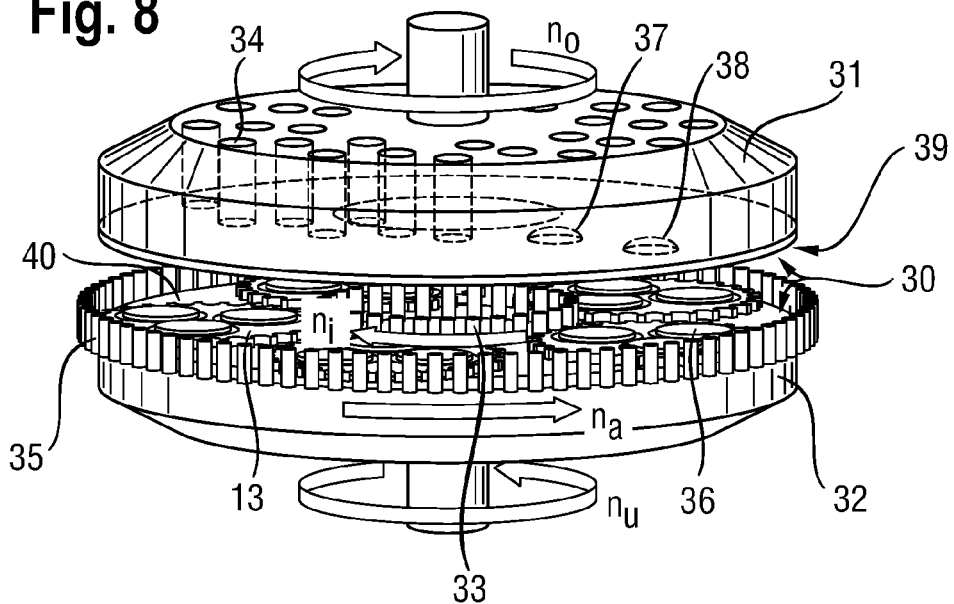
FIG. 8 shows an apparatus suitable for carrying out the method according to the invention.

In this case, R denotes the radius of the pitch circle 8 on which the carrier midpoints 4 rotate and the midpoint 3 of the double-side processing apparatus between the ring-shaped working disks 31, 32 by means of the rolling apparatus formed from the inner drive ring 33 and outer drive ring 35 (see FIG. 8) (planetary movement); N denotes the number of carriers 13 inserted into the double-side processing apparatus; r indicates the radius of an opening 1 in the carrier 13 for receiving a semiconductor wafer; and e is the radius of the pitch circle 2 around the center 4 of the carrier 13 on which the midpoint 5 of the opening 1 lies. According to the invention, each carrier comprises precisely one opening 1 for receiving a semiconductor wafer.

The carriers 13 can likewise be arranged with different distances 2x between the envelopes 6 of adjacent carriers 13 on the pitch circle 8. In this case, the maximum distance 2x between the envelopes of adjacent carriers is essential to the invention, as results according to calculation from $$x/e = R/e \cdot \sin(\pi/N^*) - r/e - 1$$

In this case, N* denotes the ratio of the round angle ($2\pi$ rad) and the angle at which the adjacent carriers are inserted into the rolling apparatus with the greatest distance with respect to one another. In this case, therefore, $\pi/N^*$ denotes half of the angle at which the two adjacent carriers 13 are inserted into the rolling apparatus with the greatest distance with respect to one another. In general, N* is not an integer since, in the case of such non-uniform distribution of the carriers with different distances with respect to one another, the angle between adjacent carriers with the greatest distance with respect to one another is generally not a divisor of the round angle. In the case of a uniform distribution of the carriers with identical distances between all adjacent carriers, N*=N.

The arrangement of the carriers 13 in the rolling apparatus formed from inner and outer pin wheels is preferably effected in such a way that the envelopes 6 of adjacent carriers 13 in each case have as far as possible identical distances with respect to one another. However, for mathematical reasons (planetary gearing equations), this can be precisely fulfilled only when the total number of pins on outer and inner pin wheels is divisible by the number of inserted carriers without a remainder. This is not fulfilled structurally for all double-side processing apparatus suitable for carrying out the method according to the invention or if it is, then usually only for a specific number of inserted carriers. The preferred arrangement with as far as possible identical distances between the envelopes 6 of adjacent carriers 13 is defined here as the one for which the sum of the absolute values of the deviations of the distances between adjacent envelopes 6 from the average distance between adjacent envelopes 6 of all the carriers 13 becomes minimal.

Furthermore, the opening 1 can be arranged differently within the different carriers 13 of a configuration. In this case, the average value of all the eccentricities $e_i$ of the carriers $LS_1$, $LS_2, \ldots, LS_N$, i=1, 2, ..., N is essential to the invention. It is preferred, however, for all the carriers 13 to have the same arrangement of the opening 1, that is to say for all the carriers 13 of a configuration to be identical.

The inequality represented in claim 1 encompasses all the special cases discussed and is therefore used for the definition of the invention.

In practice, an arrangement of the opening in the carrier and of the at least three carriers on the ring-shaped working disk and in the rolling apparatus formed from inner and outer pin wheels and the outer toothing of the carrier can always be found easily such that the inequality represented in claim 1 is satisfied:

According to embodiments of the invention, the intention is that $x/e \leq 1.2$. Therefore, proceeding from a given arrangement in which, after measurement, for example, the parameter x/e initially proves to be too large, firstly further carriers of the same type can be inserted into the rolling apparatus, to be precise preferably as many as still have space therein with a smallest possible distance from one another, and particularly preferably such that they have an as far as possible identical distance with respect to one another. As a result of this measure, the determining distance 2x between the envelopes of the opening arrangement of adjacent carriers is minimized and x/e is therefore reduced. If this still does not suffice, the carriers initially used can be exchanged for those in which the opening in each carrier lies nearer to the root circle of the outer toothing of the carrier. As a result, the crucial eccentricity e of the arrangement of the opening in the carrier is increased and x/e is therefore reduced. A combination of both measures is preferably also used.

Arrangements in which the parameter x/e essential to the invention is less than or equal to 0.55 have proved to be particularly suitable for producing semiconductor wafers having a particularly uniform thickness. This is because it has been found that the flatness of the semiconductor wafer that can be obtained with a given arrangement—for example described by the global flatness over the entire semiconductor wafer (TTV, total thickness variation; difference between maximum thickness and minimum thickness of a semiconductor wafer)—and the thickness fluctuations within a pass tend to become lower if particularly small values for x/e are realized. The particularly preferred limit value of $x/e \leq 0.55$ in this case arises as follows:

In the production of semiconductor wafers, lapping, PPG or pellets grinding is generally followed by chemical mechanical polishing, preferably simultaneous double-side polishing (DSP). Only very low material removal rates can be obtained during polishing. Therefore, polishing is time-consuming and expensive, and endeavors to manage with a lowest possible material removal. However, experience shows that a minimum removal is also necessary in the case of DSP, said minimum removal resulting from a minimum delay time required by the apparatus and process to attain a thermal equilibrium. This is the only way to obtain controllable and uniform results from pass to pass. Polishing is usually the last significant step of the shaping process during the production of semiconductor wafers and therefore has to satisfy particularly stringent requirements concerning the obtained flatness and thickness constancy of the semiconductor wafers thus processed. Experience shows that a DSP minimum removal with good and constant results is approximately 10 µm. A prerequisite for carrying out a stable DSP process is an already very good flatness of the semiconductor wafers before polishing and a very narrow distribution of the initial thickness of all the semiconductor wafers of a machine batch. In practice it has been found that the DSP removal has to be at least approximately ten times as high as the total fluctuation bandwidth of the initial thicknesses of the semiconductor wafers of a DSP batch, that is to say largest thickness of the thickest semiconductor wafer minus smallest thickness of the thinnest semiconductor wafer, in order that the obtained flatness and thickness homogeneity after the DSP pass are determined only by the properties of the DSP process carried out, and not by the precursor product properties. Given ±1 µm distribution of the initial thicknesses around the average value of a batch, therefore, approximately 20 µm DSP minimum removals are required. This is an empirical value; the removal value actually required depends on the type of polishing pad, the pressure and the kinematics as well as on the properties of the polishing agents applied.

Finally, 20-30 µm is a maximally expedient DSP removal value, not just for the economic reasons indicated. In the case of higher material removal with DSP, that is to say a longer polishing duration and, consequently, a longer time of action of the polishing agent, trace metals contained in the polishing agent unavoidably pass to the semiconductor wafers and contaminate the latter. Overall, therefore, there is a just still acceptable limit value for the flatness and thickness fluctuation in order to be able to carry out the total processing of the semiconductor wafers at a high rate in terms of quality, process yield and economic efficiency. Said limit value is approximately TTV=1 µm for PPG- or pellets-ground semiconductor wafers having a diameter of 300 mm. For larger semiconductor wafers, the still acceptable TTV value is permitted to be greater than the ratio of the area of said semiconductor wafers to that of a 300 mm semiconductor wafer; for smaller semiconductor wafers, said value has to be less in equivalence with said area ratio. It has been found that values of $x/e \leq 1.2$ and, particularly preferably, $x/e \leq 0.55$ are particularly suitable for this purpose. The area-normalized TTV value, i.e. TTV value relative to the area of a 300 mm semiconductor wafer, is designated here as TTV*.

The carriers are provided with an outer toothing, which engages into the inner and outer drive rings of the double-side processing apparatus. Since the teeth or pins of the drive rings have to have a sufficient stiffness and thus strength in order to be able to transmit the forces for the movement of the carrier, the corresponding outer toothing of the carrier also has a corresponding minimally permissible tooth profile depth. The opening in the carrier for receiving the semiconductor wafer also cannot be arranged arbitrarily close to the root circle of the outer toothing without adversely affecting the mechanical stability of the carrier. Therefore, x cannot become arbitrarily small. In practice, a value of x/e of less than 0.05 virtually cannot be achieved. Therefore, a parameter x/e where $0.05 \leq x/e \leq 0.55$ is particularly preferred.

Lapping and double-side polishing are methods which bring about a material removal from the semiconductor wafer by means of a three-body interaction—(1) lapping plate, (2) lapping agent, (3) semiconductor wafer in the case of lapping and (1) polishing pad, (2) polishing agent, (3) semiconductor wafer in the case of double-side polishing. In order to obtain a material removal, the lapping or polishing agent always has to be transported from the working gap, to which it is fed, over the edges of the semiconductor wafer and be distributed as uniformly as possible over the area of the semiconductor wafer, that is to say the interaction zone between semiconductor wafer and lapping disk in the case of lapping or between semiconductor wafer and polishing pad in the case of double-side polishing, in order to obtain a uniform material removal. For this purpose, the semiconductor wafers have to be distributed as uniformly as possible and in accordance with the relationship of the parameters describing their arrangement in accordance with claim 1 (and preferably in accordance with claim 2) over the ring-shaped region of the working disks that is available for processing.

During lapping, PPG and pellets grinding, the working surface is subject to wear. If the area swept over by the semiconductor wafers during processing lies within the area of the ring-shaped working surface, a trough-shaped thickness profile of the working layer (PPG, pellets grinding) or of the working disk (lapping) therefore forms over the course of time in a radial direction, and the semiconductor wafers processed thereby increasingly acquire an undesirably convex form. In order to counteract that, the semiconductor wafers are arranged in the carriers in such a way that, during the inherent rotation of the carriers, they extend temporarily with part of their area beyond the inner and outer edges of the ring-shaped working surface. On account of the rotation of the working disks and the rotation of the carriers around the midpoint of the apparatus, in this case this so-called "workpiece excursion" 12 (FIGS. 1, 3 and 4) sweeps over the entire edge of the working surface given a suitable choice of rotational speed, such that said working surface wears more uniformly. This necessitates an eccentric arrangement of the opening for receiving the semiconductor wafer in the carrier or a working surface having a ring width smaller than the diameter of the semiconductor wafer.

In the case of DSP, a workpiece excursion is not necessary because the polishing pad is not subject to wear that would critically alter its form.

A constant workpiece excursion by means of a semiconductor wafer arranged concentrically in the carrier over the edge of a working surface having a ring width smaller than the diameter of the semiconductor wafer proved by itself to be insufficient, however. An eccentric semiconductor wafer arrangement in the carrier is additionally required in order to obtain a high degree of flatness and thickness homogeneity.

This proved to be plausible for the following reasons: During lapping and during DSP, the eccentric "pump movement" of the semiconductor wafer evidently supports the transport of lapping agent and polishing agent, respectively, from the edge to the center of the semiconductor wafer and thus enables a uniform material removal. (A semiconductor wafer arranged eccentrically in the carrier performs a gyroscopic movement similar to the impeller of a centrifugal pump under the inherent rotation of the carrier driven by the rolling apparatus and thus emits kinetic energy to the surrounding fluid—polishing agent, lapping agent or cooling lubricant—such that fluid transport is effected.) In the case of PPG or pellets grinding, this pump movement correspondingly leads to a more uniform distribution of the cooling lubricant over a semiconductor and working layer surface and thus counteracts heating and deformation of the working gap. Furthermore, semiconductor wafers arranged with insufficient eccentricity in the carrier, during the rotation of the carrier around the center of the apparatus in the working gap, consume or displace the lapping or polishing agent or the cooling lubricant for the semiconductor wafers of the subsequent carriers that are rotating on virtually the same trajectory. This leads to non-identical processing results of the semiconductor wafers of different carriers in the same processing pass.

On account of the characteristics of the planetary gearing kinematics (cycloidal trajectories), this depletion in the working gap takes place anisotropically since the polishing or lapping agent or the cooling lubricant is fed only at points via individual feeds 34 in the upper working disk 31 (FIG. 8) and is not distributed sufficiently homogeneously in the working gap owing to a lack of eccentricity of the semiconductor wafer arrangement in the carriers.

Moreover, the advantageous free movement of the semiconductor wafer in the receiving opening of the carrier is suppressed by an insufficient eccentricity. This is because, for reasons of symmetry, given a concentric arrangement of the semiconductor wafer, the forces acting on the semiconductor wafer during the movement in the working gap balance one another, such that no resultant torque that drives an inherent rotation in the receiving opening acts on the semiconductor wafer. (The trajectory of an arbitrary point of a semiconductor wafer arranged concentrically in the carrier is always a closed circle). A lack of inherent rotation of the semiconductor wafers in their receiving openings leads to non-rotationally symmetrical thickness profiles, that is to say "wedge-shaped" semiconductor wafers.

If an arrangement not according to the invention in this way is additionally embodied such that wide interspaces arise between the semiconductor wafers or the envelopes of their arrangement in adjacent carriers, the processing operated in this way becomes particularly uneconomic since, expensive polishing agent or lapping agent flows away from the working gap via the wide interspaces without having been used and the available working surface is insufficiently covered with semiconductor wafers (small batch sizes of a processing pass; low throughput). Although polishing or lapping agent can in part be reused and be passed in an equilibrium of partly rejected used polishing/lapping agent and proportionally metered new polishing/lapping agent a number of times to the working gap and this process can be adapted to the proportion of unused lapping/polishing agent within certain limits, this always results in considerable losses due to efflorescence (polishing agent) or clumping (lapping agent) and requires high efforts as to filtering and separation of lapping or polishing slurry whilst accepting a poorer surface quality of the semiconductor wafers processed this way.

In addition, the lapping plate and primarily the polishing pad are heated to a greater extent in regions with depleted lapping or polishing agent than in regions with an excess of lapping or polishing agent, since in the former the cooling effect of freshly supplied lapping/polishing agent is absent. Particularly the polishing pad during polishing, which consists of foamed plastic or woven or felted plastic fibers and therefore conducts heat very poorly, is heated particularly rapidly. As a result, it expands locally. In the case of an arrangement not according to the invention, the expansion takes place non-uniformly over the working surface of the working disk, and a non-uniform material removal results on account of the pressure conditions that are non-uniform over the trajectory of a semiconductor wafer. During polishing, the material conversion additionally has a temperature-dependent profile owing to the chemical component of the polishing mechanism. Locally fluctuating temperatures of a polishing pad over which semiconductor wafers sweep non-uniformly therefore lead to particularly non-uniform material removal and, in addition, to greatly fluctuating surface defects (incipient etching, increased basic roughness ("polishing haze")).

During grinding by means of pad or pellets, by contrast, the material removal is effected by means of a two-bodied interaction—(1) abrasive grain bonded in the abrasive coating (pad or pellets), (2) semiconductor wafer. The problem of uniform mass transport as in lapping or double-side polishing is obviated here because the abrasive grain is fixedly bonded into the working layer and, by means of the advantageous planetary kinematics, is uniformly guided to each surface location of the semiconductor wafer that is to be processed.

During grinding using bonded grain, further processes predominate, therefore, which determine whether a semiconductor wafer having uniform or having non-uniform thickness is obtained.

In contrast to polishing or lapping where the material removal takes place slowly and with low material removal rates by means of a rolling movement of the loose polishing or lapping grain in the contact zone between lapping plate or polishing pad and semiconductor wafer, the material removal in the case of grinding using bonded grain takes place with comparatively significantly higher material removal rates than in the case of polishing or lapping on account of the direct force transmission of the grain movement on account of the relative movement of working layer and semiconductor wafer.

Relative to the decrease in thickness of all the semiconductor wafers of a machine batch, typical removal rates of 0.5-1 µm/min are achieved in the case of polishing, typically 3-5 µm/min in the case of lapping, depending on lapping grain material and size, and 20-40 µm/min in the case of grinding. In the case of grinding, therefore, a particularly large amount of abrasive slurry arises per unit time, to be precise uniformly over the entire area of the semiconductor wafer. It has to be led away in order that the abrasive pad is not clogged and maintains a uniform cutting capacity and local overheating as a result of different sliding friction owing to accumulated abrasive slurry is thus avoided. Here a sufficiently large eccentricity of the semiconductor wafer arrangement in the carrier with the associated gyroscopic or pump movement evidently fosters a rapid removal of the abrasive slurry that arises. Moreover, the gyroscopic movement ensures a uniform supply of cooling lubricant and hence supports a sufficient and uniform cooling of the entire surface of the semiconductor wafers.

Particularly in the case of grinding (two-bodied interaction), but analogously also in the case of lapping or polishing, the semiconductor wafer can "float" at locations with accumulated cooling lubricant (or lapping or polishing agent) and thus move from the material-removing engagement with the working layer. This results in a material removal that is non-uniform over the trajectory with impaired flatnesses and thickness fluctuations of the semiconductor wafers. By increasing the distance between adjacent carriers and thus the semiconductor wafers, for example by removing one or more carriers from the processing apparatus and distributing the remaining carriers as uniformly as possible over the space thus gained, the problem of locally accumulated operating agent or inadequately removed grinding, lapping or polishing slurry is not solved since, via the large interspaces, operating medium would only simply drain away unused, without having come into contact with the semiconductor wafer. This actually reinforces a non-uniform temperature of the working gap. Moreover, a procedure like that is uneconomic (fewer semiconductor wafers per machine batch; waste of operating medium).

An eccentric arrangement of the semiconductor wafer in the carrier leads, during the rolling of the carrier (inherent rotation and rotation around the apparatus midpoint), to changes in the loads according to absolute value and direction with which the semiconductor wafer is pressed against the wall of the receiving opening during the movement along its trajectory, and the distribution of the frictional forces over its area. As a result, an inherent rotation of the semiconductor wafer is driven within the receiving opening in the carrier, in which, after all, it only lies loosely. This inherent rotation of the semiconductor wafer yields an additional third degree of freedom in relation to the pure planetary rotation—having only two degrees of freedom—of the carriers, around the apparatus center. This additional degree of freedom of the workpiece movement leads to particularly isotropic processing of the semiconductor wafer with particularly good flatnesses and good thickness homogeneity of all the semiconductor wafers of a pass configuration. A lack of eccentricity suppresses the inherent rotation of the semiconductor wafers in the carriers and leads to rotationally asymmetrical semiconductor wafers, for example in the form of a wedge shape of their thickness profile.

The position of the upper working disk relative to the lower working disk is completely determined by three points. (Three points completely determine the position of a plane.) In the case of three carriers each with a semiconductor wafer with precisely concentric arrangement in the carrier, the position of the upper working disk with respect to the lower working disk and thus the working gap between the working disks would actually be precisely determined. An initial oblique position of the upper working disk relative to the lower working disk, said oblique position being caused for example by semiconductor wafers having different initial thicknesses, would thereby lead during processing, as an undamped wobble movement of the upper working disk relative to the lower working disk, to wedge-shaped semiconductor wafers having non-identical thicknesses.

If the semiconductor wafers additionally perform an eccentric movement, however, on account of an eccentric arrangement within the carrier, the bearing points on the semiconductor wafers that determine the position of the upper working disk are correspondingly displaced constantly during processing, and a wobble movement no longer arises or would be greatly damped, such that the form and the thicknesses of the semiconductor wafers of a pass batch are rapidly matched and good flatness and thickness constancy are obtained over all the semiconductor wafers in a pass. Thus, given sufficiently eccentric arrangement of the semiconductor wafers, a good flatness and thickness homogeneity can even be obtained in the case of just a total of three semiconductor wafers in a total of three carriers—the minimum possible batch in a processing pass.

It is particularly advantageous to increase the number of semiconductor wafers additionally, that is to say to choose as many carriers as possible with semiconductor wafers correspondingly coming as close to one another as possible in adjacent carriers (small distances 2x). As a result, the position of the upper working disk relative to the lower working disk is geometrically overdetermined (more than three bearing points), and this results in particularly flat semiconductor wafers with uniform thickness. (Semiconductor wafers having form or thickness deviations can no longer move through the working gap, which is already defined by three points, without inevitably being processed in material-removing fashion toward a plane-parallel form.)

Good processing results are therefore obtained only for specific ratios of the distances 2x and eccentricities e within the preferred range $x/e \leq 1.2$, and this holds true independently of the specific mechanism of action of the material removal for all double-side processing methods with planetary kinematics in which each carrier has an opening for receiving a semiconductor wafer. This is the case particularly with large semiconductor wafers having a diameter of more than 300 mm. The semiconductor wafers can have, in particular, a diameter of 400 mm or more. In the case of silicon wafers, a diameter of 450 mm will increasingly become important for practical applications.

The methods which simultaneously process both sides of a group of semiconductor wafers at the same time will probably also be advantageous for even larger semiconductor wafers.

The applicability is only restricted by constructional limits, for example when the required working disk diameter would have to be significantly more than 2.5 m in order still to be able to arrange at least three carriers of sufficient size for receiving a respective semiconductor wafer thereon. For very large semiconductor wafers, particularly arrangements with only precisely one semiconductor wafer per carrier will gain in importance. (An assumed minimum configuration for a double-side processing apparatus having three carriers each having three semiconductor wafers of 450 mm would have a diameter of at least 2355 mm, for example. A kinematically preferred design for five carriers each having three semiconductor wafers of 450 mm would result in a diameter of the working disk of at least 2955 mm, for example. The appropriate carriers would no longer be stable enough to apply the frictional forces increased by 225% in a non-destructive manner compared with a configuration of three semiconductor wafers having a diameter of 300 mm.) By contrast, apparatuses having carriers bearing only one semiconductor wafer in each case are definitely applicable up to a semiconductor wafer diameter of 600 mm.

EXAMPLES AND COMPARATIVE EXAMPLES

Example 1

The relationship according to the invention will firstly be elucidated in greater detail with reference to FIG. 1. FIG. 1 shows an example of an arrangement according to the invention. In the example shown, five (N=5) carriers 13 are arranged with regard to their respective midpoints 4 on a pitch circle 8 having a radius R around the midpoint 3 of the double-side processing apparatus on the ring-shaped working disks. In each carrier 13, precisely one semiconductor wafer having a diameter of 450 mm is inserted into a receiving opening 1 having a radius r.

In this case, the midpoint 5 of the opening 1 is arranged on a pitch circle 2 having a radius e around the midpoint 4 of the carrier. In this case, the radius r of the opening 1 is somewhat larger than the radius r* of the semiconductor wafer, such that the semiconductor wafer remains freely movable and can freely rotate within the opening 1 or roll by its circumference on the wall of the opening 1. The precise position of the semiconductor wafer within the opening 1 and its movement during processing are unknown on account of the loose insertion. With regard to the present invention, however, the precise position of the semiconductor wafer in the opening during processing is unimportant; therefore, the semiconductor wafer is not shown in FIG. 1 for reasons of clarity.

As a result of the rotation of the carrier 13 about its midpoint 4, the opening 1 sweeps over an area bordered by the circular envelope 6 arranged concentrically with respect to the midpoint 4. In this case, by virtue of a construction constraint, the envelope 6 always lies completely within the pitch circle 7 of the outer toothing of each carrier 13, with which the carrier rolls in the rolling apparatus formed from inner and outer pin wheels and thus rotates on a planetary path around the center 3 of the double-side processing apparatus. According to the invention, each carrier 13 comprises precisely one opening 1 in each case. The envelopes 6 of adjacent carriers 13 are at a distance 2x from one another.

For the example shown in FIG. 1, a double-side processing apparatus of the type "AC-2000" from Peter Wolters GmbH (Rendsburg, Germany) was used and processing according to the PPG method was carried out thereon. The apparatus has a pitch circle diameter 20 of the outer pin wheel of 1970 mm and a pitch circle diameter 14 of the inner pin wheel of 530 mm. Consequently, the carriers have a pitch circle diameter 7 of their outer toothing of 720 mm, and the radius of the pitch circle 8 on which the midpoints 4 of the carriers 13 lay was consequently R=625 mm. The carriers 13 were then designed according to the invention such that the midpoint 5 of an opening 1 having a radius r=225.5 mm for receiving a semiconductor wafer 13 having a radius r*=225 mm (Ø 450 mm) was arranged eccentrically by an absolute value e=111.5 mm relative to the midpoint 4 of the carrier. The semiconductor wafer thus had 0.5 mm radial play or that is to say 1 mm diametrical play within the opening. The size of the ring-shaped working layer 40 was tailored such that, with the eccentricity chosen, the openings 1 with the semiconductor wafers temporarily extended with part of their areas up to 10 mm beyond its inner edge 11 and outer edge 10 (excursion 12).

The eccentricity e of the opening in the carrier had been chosen to be as large as possible, namely such that just enough material (hardened steel) still remained in order that the carrier could not bend away in this region, which regularly enters the "excursion" and is therefore not guided and supported by the working layers vertically. With R=625 mm, N=5, r=225.5 mm and e=111.5 mm, this results in x=30.366 mm and x/e=0.272. Consequently, x/e lies in the particularly preferred range of $0.05 \leq x/e \leq 0.55$.

The PPG abrasive pad in the example shown in FIG. 1 contained diamond as abrasive, having a grain size of 2 to 6 µm (5% and 95% values of the cumulative grain size concentration). As a result of the relative movement of working disks and semiconductor wafers under pressure and with addition of water, the abrasive effected a chipping material removal with geometrically indeterminate cutting edges.

The apparatus used for the example shown in FIG. 1 had an apparatus for the targeted deformation of the upper working disk in such a way that the working gap between the working layers, in which the semiconductor wafers are moved during processing, could be kept parallel under mechanical (pressure build-up) and thermal alternating load (chipping work, friction work, drive losses). The deformation of the upper working disk took place in a closed control loop with the aid of two sensors arranged in the upper working disk, which sensors contactlessly measure the distance between the two surfaces of the working disks continuously during processing (reference symbol 37 in the schematic apparatus illustration in FIG. 8).

Figure 7:
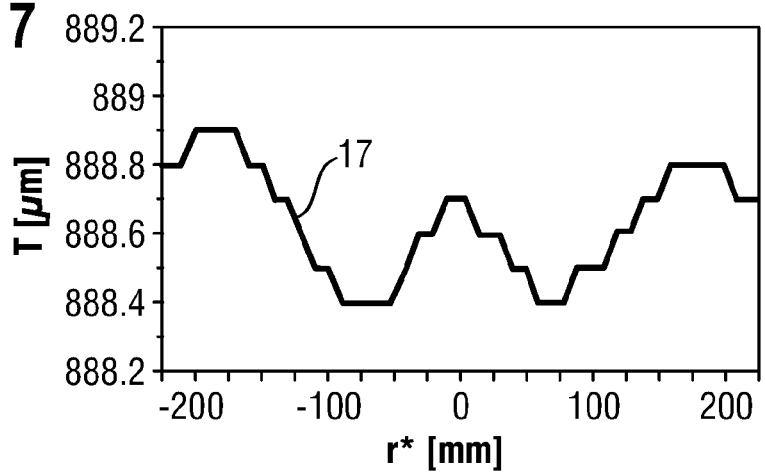
FIG. 7 shows, as an example, the diametrical thickness profile of a semiconductor wafer after processing by the method according to the invention.

FIG. 7 shows the diametrical thickness profile T(r*) in micrometers (µm) of a semiconductor wafer processed in accordance with example 1. The thickness profile was determined by a capacitive measurement method in which two measurement probes situated opposite one another trace eight radii (at angles of 45° between two neighboring radii) over the front and rear sides of the semiconductor wafer. The measurement probe, that surface of the semiconductor wafer which faces it, and the small amount of air situated therebetween, form a capacitor in each case. The thickness of the respective small amount of air (dielectric) is determined by measurement of the capacitance. It yields a direct measure of the height profile of the respective side of the semiconductor wafer since the measurement probes are secured at a fixed distance with respect to one another on a common clip embracing the semiconductor wafer. After calibration of the measurement probe distance by means of the measurement of a semiconductor wafer of known thickness, the difference between these height values then yields the absolute thickness of the semiconductor wafer.

The measuring apparatus measures eight radii, each at a distance of 45°, and compiles therefrom thickness profiles of four diameters. FIG. 7 shows the average thickness profile calculated from these four diameter measurements. FIG. 7 shows that the thickness of a semiconductor wafer processed with the arrangement illustrated in FIG. 1 is extremely uniform (curve 17). The "edged" structure of the thickness profile thus obtained reflects the measurement accuracy of the 450 mm prototype measuring instrument used. The flatness of the semiconductor wafer processed by the method according to the invention approximates this resolution limit.

Comparative Example 1

FIG. 2 shows, as a comparative example, an arrangement not according to the invention. The same apparatus as in example 1 (FIG. 1) was used. Abrasive pad and cooling lubricant type and flow (water) were identical. The pressure of the upper working disk on the lower working disk was reduced proportionally to the number of semiconductor wafers in a batch in order to obtain an identical material removal rate (comparable mechanical and thermal alternating loads during processing). The distance of the working gap was continuously kept constant by means of a measuring and adjusting apparatus during processing, as described in example 1, in order to obtain optimal flatness and minimal fluctuation of the average individual thicknesses of each semiconductor wafer around the average value of the thicknesses of all the semiconductor wafers of a processing pass.

The only difference was that only three carriers were inserted in comparative example 1 instead of five carriers (of the maximum possible number) as in example 1, to be precise with identical distances 2x between the envelopes 8 of adjacent carriers 13, that is to say respectively at an angle of 120° relative to one another.

The characteristic parameters R=625 mm, r=225.5 mm (semiconductor wafer with r*=225 mm, that is to say a diameter of 450 mm) and e=111.5 mm determining the arrangement remained unchanged in comparative example 1 with respect to example 1; however, now N=3 (in contrast to N=5 from example 1). With x=204.266 mm, as expected this results in a very large half distance between the envelopes 6 of the arrangement of the opening 1 for receiving the semiconductor wafer between adjacent carriers. With x/e=1.832, the parameter that is crucial according to the invention lies in the range not according to the invention.

Figure 6:
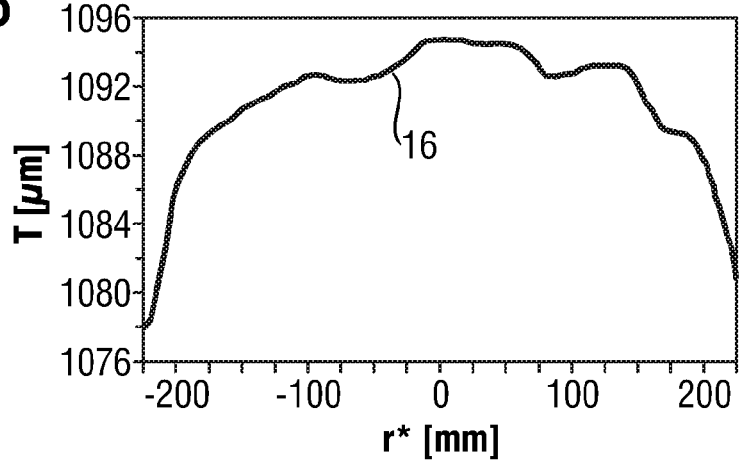
FIG. 6 shows, as a further comparative example, the diametrical thickness profile of a semiconductor wafer after processing by a second method not according to the invention.

An arrangement having such large distances yields extremely different semiconductor wafers from processing pass to processing pass, thus for example one having a thickness profile as shown in FIG. 6. (The thickness profile was determined by the measurement method explained in connection with FIG. 7 and in the same way.) FIG. 6 shows a thickness profile of a semiconductor wafer having a convexly irregular form. On account of the eccentric position of the semiconductor wafers in the carrier, a sufficient inherent rotation of the semiconductor wafer evidently still arose in the receiving opening, such that the thickness profile is not asymmetrically wedge-shaped, but still has a slight rotational symmetry. (The region of greatest thickness lies in the center of the semiconductor wafer.) However, the averaging of the measurement method over the measurement tracks recorded for different azimuthal angles has the effect that the one-dimensional thickness profile obtained always looks largely rotationally symmetrical, even though this is not the case for the actual two-dimensional thickness profile over the entirety of the semiconductor wafer.

Example 1 (FIG. 1) and comparative example 1 (FIG. 2) prove that an eccentric arrangement of the semiconductor wafer in the carrier, which is identical for FIG. 1 and FIG. 2, alone is not sufficient for obtaining good processing results.

Comparative Example 2

FIG. 3 shows a further comparative example of an arrangement not according to the invention, with opening 1 arranged completely concentrically in the carriers. The figure shows the arrangement of a total of six (N=6) 450 mm semiconductor wafers (r*=225 mm) in a total of six carriers with a pitch circle diameter of their outer toothing of 482.85 mm. The example was obtained using a processing apparatus of the type AC1500P3 from Peter Wolters GmbH with a pitch circle 8 for the rotation of the carrier midpoints around the apparatus midpoint 3 with R=507.75 mm. The processing was carried out as PPG with the same working layers and cooling lubricant (water) as in example 1 and comparative example 1. On account of the small size of the carriers, an arrangement of a 450 mm semiconductor wafer is possible only almost completely concentrically. As in the other examples and comparative examples shown and as is customary in the prior art, the openings in the carrier for receiving a semiconductor wafer are lined with a plastic ("insert"). The latter prevents direct contact of the semiconductor wafer with the material of the carrier and thus prevents damage to the semiconductor wafer through direct contact with the hard steel of the carrier material and contamination by trace metals (Fe, Ni, Cu). The lining is introduced by means of an injection-molding method. Owing to the elastic deformation of the steel body on account of the high pressures during injection molding and as a result of shrinkage of the introduced plastic during cooling, the lining generally has a small roundness deviation and eccentricity. This was approximately e=0.5 mm in the case shown in FIG. 2.

This results in a distance 2x between the envelopes 6 of the arrangement of the opening 1 for receiving the semiconductor wafer where x=28.363 mm, and x/e=427 lies in the range not according to the invention.

Although the distance between the envelopes in comparative example 2 is even smaller than in example 1 according to the invention, semiconductor wafers with very poor processing results for flatness and thickness fluctuation are obtained. A densest possible occupancy—obvious for economic reasons—of the available working surface with semiconductor wafers is therefore, by itself, likewise insufficient for obtaining good processing results.

The flatnesses specifically obtained in the examples and comparative examples explained and the methods, apparatuses and parameters of the arrangement of the semiconductor wafers used here are summarized in table 1. Table 1 shows the parameter x/e, the flatness (TTV) obtained, and also the characteristic parameters of the apparatus used for semiconductor wafers processed according to the invention and not according to the invention by PPG, lapping and DSP. Table 1 additionally shows the flatnesses obtained for a multiplicity of further arrangements, apparatuses and methods used here, which will not be specifically explained further here.

Example 2

Figure 4:
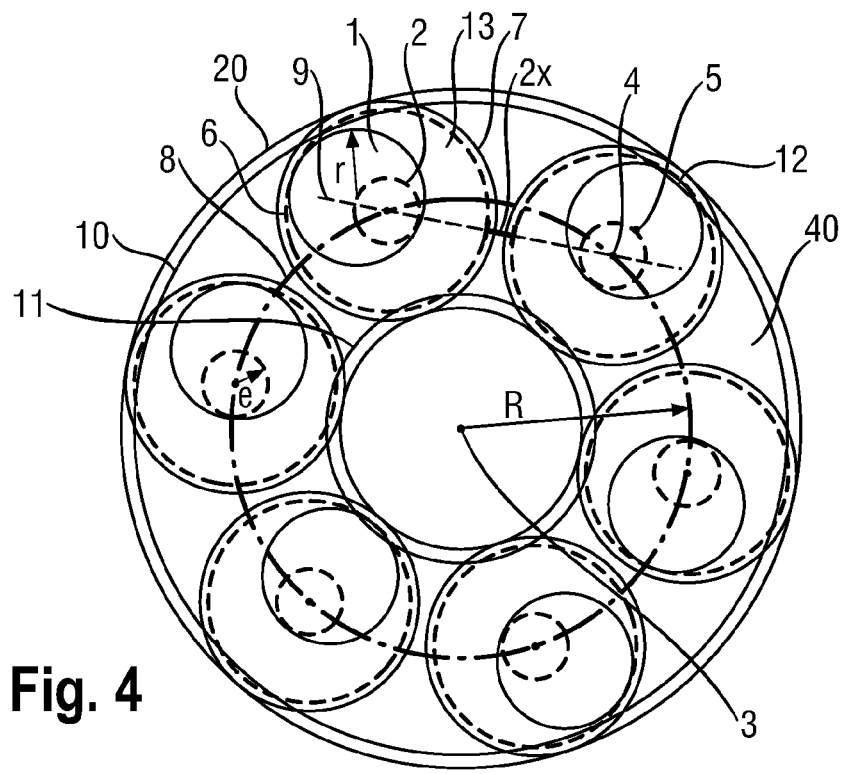
FIG. 4 shows a further example of an arrangement according to the invention of a semiconductor wafer in a carrier and number, size and arrangement of the carriers in the double-side processing apparatus.

Example 2, finally, compares with comparative example 2 an arrangement according to the invention on the same processing apparatus (N=6, R=507.75). The arrangement is illustrated in FIG. 4. The rolling apparatus was again occupied maximally densely with six carriers. In order to achieve an eccentric arrangement of the semiconductor wafers in the small carriers in example 2 according to the invention (FIG.

4) in contrast to comparative example 2 (FIG. 3), smaller semiconductor wafers were used (r*=150 mm, that is to say semiconductor wafers having a diameter of 300 mm) and inserted in openings 1 where r=150.5 mm. In this case, the eccentricity e of the openings 1 was chosen in such a way (e=72.5 mm) that the envelopes 6 of adjacent carriers in both cases had almost identical distances 2x (x=30.875 in example 2 and x=28.363 in comparative example 2). For example 2, x/e=0.426 arises in the preferred range.

The semiconductor wafers PPG-processed in accordance with example 2 in the same way as in comparative example 2 yielded the results summarized in table 1 (TTV=0.9 μm).

Example 2 and comparative example 2 thus show that a dense occupancy (small distances 2x between the envelopes 6 of the arrangement of the opening 1 of adjacent carriers 13) is necessary but by itself insufficient for obtaining good processing results. (In the case of an excessively large distance 2x as in comparative example 1, a good processing result cannot be obtained with any choice of eccentricity e.)

Further Examples and Comparative Examples

Figure 5:
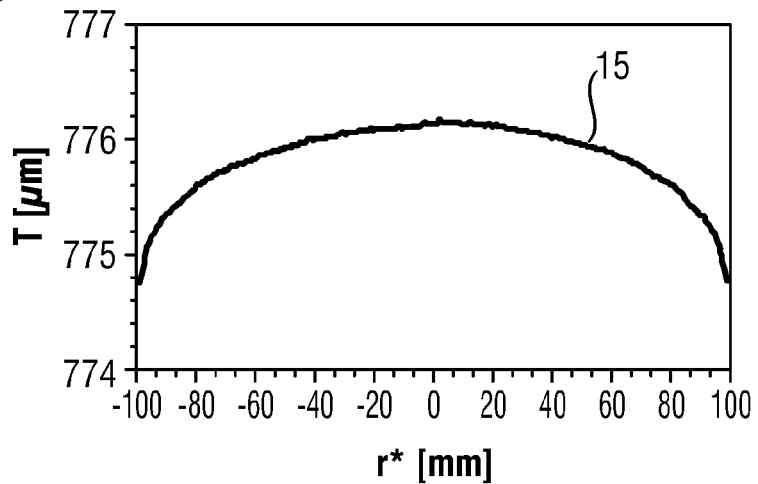
FIG. 5 shows, as a comparative example, the diametrical thickness profile of a semiconductor wafer after processing by a first method not according to the invention.

Table 1 also contains examples and comparative examples obtained by lapping processing. For semiconductor wafers processed according to the invention by means of lapping, flat and thickness-homogeneous semiconductor wafers having very flat thickness profiles are obtained, which are similar to example 1—shown in FIG. 7—of a semiconductor wafer processed by PPG. In the case of a lapping method carried out not according to the invention (x/e>1.2), semiconductor wafers having a thickness profile as shown in FIG. 5, for example, are obtained. In a manner similar to that in the case of semiconductor wafers processed not according to the invention by means of PPG (FIG. 6), FIG. 5 shows a semiconductor wafer having a convex thickness profile. Once again the thickest location is situated in the center of the semiconductor wafer, but the convex form of a semiconductor wafer lapped not according to the invention has a more uniform and markedly rotationally symmetrical decrease in the thickness 15 from the center to the edge of the semiconductor wafer.

Figure 9:
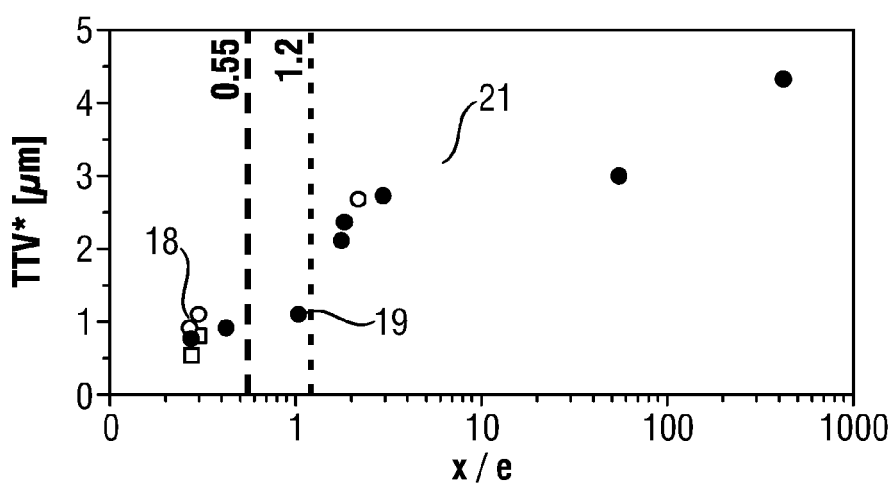
FIG. 9 shows the plotting of the area-normalized flatness TTV* obtained against the parameter x/e, essential to the invention, of the arrangement of carriers and semiconductor wafers for different apparatuses and processing methods.

The results summarized in table 1 are illustrated graphically in FIG. 9. The filled circles (●) relate to the PPG method, the unfilled circles (○) relate to the lapping method, and the unfilled squares (□) relate to the DSP method. In order to be able to compare the TTV for the various examples and comparative examples carried out with parameter x/e according to the invention and not according to the invention for the various semiconductor wafer diameters used therefor, the TTV value actually determined in each case over the entire semiconductor wafer surface was converted to the value produced computationally for a semiconductor wafer having a diameter of 300 mm and the same flatness. The TTV value of a 450 mm semiconductor wafer was thus divided by 2.25 in order to obtain a comparative value TTV*=TTV/2.25, which takes account of the measurement area of the 450 mm semiconductor wafer which, in contrast to that of a 300 mm semiconductor wafer, is 2.25 times as large as the latter.

FIG. 9 shows that the range according to the invention for x/e through TTV*≤1 μm is distinctly separated from the range not according to the invention for x/e where TTV*>1 μm. Parameters x/e where TTV*<1 μm are particularly preferred here for DSP and PPG. For semiconductor wafers processed by lapping, the particularly preferred TTV* value is permitted to be somewhat greater than 1 μm (18). Lapping produces a surface having, on account of the brittle-erosive material removal mechanism, a significantly deeper damage to near-surface layers of the semiconductor wafers (sub-surface damage), the removal of which necessitates an additional material removal step inserted between lapping and polishing, for example etching or fine grinding using a single-side fine-grinding apparatus that sequentially processes both sides in a material-removing fashion, or polishing with increased material removal. On account of this additional processing that is therefore required anyway for lapped semiconductor wafers, somewhat poorer relative flatnesses TTV* are therefore still acceptable.

| x/e | 0.27 | 1.83 | 55.73 | 427.41 | 0.43 | 1.76 | 1.04 | 2.94 |
|---|---|---|---|---|---|---|---|---|
| TTV | 1.7 | 5.3 | 6.7 | 9.7 | 0.9 | 2.1 | 1.1 | 2.7 |
| TTV* | 0.8 | 2.4 | 3.0 | 4.3 | 0.9 | 2.1 | 1.1 | 2.7 |
| Method | PPG | PPG | PPG | PPG | PPG | PPG | PPG | PPG |
| Apparatus | AC2000 | AC2000 | AC1500P | AC1500P | AC1500P | AC1500P | AC1500P | AC1500P |
| e | 111.5 | 111.5 | 0.5 | 0.5 | 72.5 | 37.5 | 72.5 | 37.5 |
| N | 5 | 3 | 6 | 3 | 6 | 6 | 5 | 5 |
| R | 625.0 | 625.0 | 507.7 | 507.7 | 507.7 | 507.7 | 507.7 | 507.7 |
| r | 225.5 | 225.5 | 225.5 | 225.5 | 150.5 | 150.5 | 150.5 | 150.5 |
| x | 30.4 | 204.3 | 27.9 | 213.7 | 30.9 | 65.9 | 75.4 | 110.4 |

| x/e | 2.19 | 0.30 | 0.27 | 0.30 | 0.27 |
|---|---|---|---|---|---|
| TTV | 6 | 1.1 | 0.9 | 0.8 | 1.2 |
| TTV* | 2.7 | 1.1 | 0.9 | 0.8 | 0.5 |
| Method | Lapping | Lapping | Lapping | DSP | DSP |
| Apparatus | AC1500L | AC1500/12 | AC1500/13 | AC1500P | AC2000P |
| e | 24.75 | 100 | 125 | 100 | 111.5 |
| N | 5 | 5 | 5 | 5 | 5 |
| R | 517.5 | 477.9 | 526.0 | 477.9 | 625.0 |
| r | 225.3 | 150.5 | 150.5 | 150.5 | 225.5 |
| x | 54.2 | 30.4 | 33.7 | 30.4 | 30.4 |

LIST OF REFERENCE SYMBOLS AND ABBREVIATIONS

| | |
|---|---|
| 1 | Opening for receiving a semiconductor wafer |
| 2 | Pitch circle of the arrangement of an opening in a carrier for receiving a semiconductor wafer |
| 3 | Midpoint of the double-side processing apparatus |
| 4 | Midpoint of a carrier |
| 5 | Midpoint of an opening for receiving a semiconductor wafer |
| 6 | Enveloping circular line of the arrangement of the opening for receiving a semiconductor wafer in the carrier around the midpoint of the carrier |
| 7 | Pitch circle of the outer toothing of a carrier |
| 8 | Pitch circle of the rotation of the carrier midpoints around the midpoint of the double-side processing apparatus (planetary path) |
| 9 | Straight line connecting the midpoints of two adjacent carriers |
| 10 | Outer edge of the ring-shaped working disk |

-continued

LIST OF REFERENCE SYMBOLS AND ABBREVIATIONS

| | |
|---|---|
| 11 | Inner edge of the ring-shaped working disk |
| 12 | Region of the excursion of the semiconductor wafer beyond the edge of the working disk |
| 13 | Carrier |
| 14 | Pitch circle of the inner drive ring |
| 15 | Convex thickness profile of a semiconductor wafer |
| 16 | Convexly irregular thickness profile of a semiconductor wafer |
| 17 | Uniform thickness profile of a semiconductor wafer |
| 18 | Set of method configurations with x/e parameter and TTV* in the range preferred according to the invention |
| 19 | Set of method configurations with x/e parameter and TTV* outside the preferred range but still within the range according to the invention |
| 20 | Pitch circle of the outer drive ring |
| 21 | Set of method configurations with x/e parameter and TTV* in the range not according to the invention |
| 30 | Working gap |
| 31 | Upper working disk |
| 32 | Lower working disk |
| 33 | Inner drive ring |
| 34 | Holes for feeding operating agents |
| 35 | Outer drive ring |
| 36 | Semiconductor wafer |
| 37 | Measuring apparatuses for working gap width |
| 39 | Upper working layer |
| 40 | Lower working layer |
| e | Pitch circle radius of the arrangement of an opening for receiving a semiconductor wafer in a carrier (eccentricity of the opening) |
| $n_a$ | Rotational speed of the outer drive ring |
| $n_i$ | Rotational speed of the inner drive ring |
| $n_o$ | Rotational speed of the upper working disk |
| $n_u$ | Rotational speed of the lower working disk |
| r* | Radius of a semiconductor wafer |
| r | Radius of the circular opening in a carrier for receiving a semiconductor wafer |
| N | Number of carriers in the double-side processing apparatus |
| N* | Ratio of the round angle to the angle at which the adjacent carriers are inserted into the rolling apparatus with the greatest distance with respect to one another |
| R | Pitch circle radius of the rotation of the carrier midpoints around the midpoint of the double-side processing apparatus (planetary path radius) |
| T | Thickness of a semiconductor wafer |
| TTV | Total thickness variation (range of the thickness variation over the entire semiconductor wafer, min . . . max) |
| TTV* | Area-normalized TTV, i.e. TTV relative to the area of a 300 mm semiconductor wafer |
| x | Half of the distance between the envelopes 6 of two adjacent carriers |

What is claimed is:

1. A method for the simultaneous material-removing processing of both sides of at least three semiconductor wafers, the method comprising:
providing a double-side processing apparatus including two rotating ring-shaped working disks and a rolling apparatus configured to rotate at least three carriers, each carrier including precisely one opening adapted to receive a respective one of the semiconductor wafers in a freely movable fashion, the carriers being arranged in the double-side processing apparatus and the openings being disposed in the carriers so as to satisfy the inequality:

$$R/e \cdot \sin(\pi/N^*) - r/e - 1 \leq 1.2$$

where N* denotes a ratio of the round angle and an angle at which adjacent carriers are inserted into the rolling apparatus with the greatest distance with respect to one another, r denotes a radius of each opening for receiving a respective semiconductor wafer, e denotes a radius of a pitch circle around a midpoint of the carrier on which the opening is arranged, and R denotes a radius of the pitch circle on which the carriers move between the working disks by means of the rolling apparatus;
disposing the semiconductor wafers between the two rotating ring-shaped working disks; and
rotating the at least three carriers using the rolling apparatus so as to move the semiconductor wafers on a cycloidal trajectory between the working disks.

2. The method as recited in claim 1, wherein the carriers are arranged in the double-side processing apparatus and the openings are arranged in the carriers so as to satisfy the inequality:

$$0.05 \leq R/e \cdot \sin(\pi/N^*) - r/e - 1 \leq 0.55.$$

3. The method as recited in claim 1, wherein the semiconductor wafers have a diameter of at least 400 mm.

4. The method as recited in claim 2, wherein the semiconductor wafers have a diameter of at least 400 mm.

5. The method as recited in claim 1, wherein the openings of the carriers have the same size and the openings of the carriers are arranged in the carriers in the same way.

6. The method as recited in claim 2, wherein the openings of the carriers have the same size and the openings of the carriers are arranged in the carriers in the same way.

7. The method as recited in claim 3, wherein the openings of the carriers have the same size and the openings of the carriers are arranged in the carriers in the same way.

8. The method as recited in claim 1, wherein, on each carrier, an enveloping circular line around the midpoint of the carrier is defined, which precisely completely encompasses the opening for receiving the respective semiconductor wafer, and wherein the carriers are arranged in the rolling apparatus such that a sum of the absolute values of deviations of distances between the enveloping circular lines of adjacent carriers from the average distance between adjacent enveloping circular lines is minimal.

9. The method as recited in claim 8, wherein the distances between the enveloping circular lines of each adjacent pair of carriers is identical.

\* \* \* \* \*